(12) United States Patent
Sato et al.

(10) Patent No.: US 8,888,925 B2
(45) Date of Patent: Nov. 18, 2014

(54) NOZZLE, SUBSTRATE PROCESSING APPARATUS, AND SUBSTRATE PROCESSING METHOD

(75) Inventors: Masanobu Sato, Kyoto (JP); Hiroyuki Yashiki, Kyoto (JP); Mai Yamakawa, Kyoto (JP); Takayoshi Tanaka, Kyoto (JP); Ayumi Higuchi, Kyoto (JP); Rei Takeaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 351 days.

(21) Appl. No.: 13/408,563

(22) Filed: Feb. 29, 2012

(65) Prior Publication Data

US 2012/0222707 A1  Sep. 6, 2012

(30) Foreign Application Priority Data

Mar. 1, 2011 (JP) .................................. 2011-044375
Mar. 30, 2011 (JP) .................................. 2011-075660

(51) Int. Cl.
*B08B 3/04* (2006.01)
*H01L 21/67* (2006.01)

(52) U.S. Cl.
CPC .............................. *H01L 21/67051* (2013.01)
USPC ............... 134/25.5; 134/32; 134/33; 134/42; 134/144; 134/147; 134/148; 134/151; 134/153; 134/157; 134/180; 134/181; 134/184; 134/185; 134/198

(58) Field of Classification Search
CPC ........... B08B 3/00; B08B 3/02; B08B 3/024; B08B 3/04; B08B 3/10; B08B 3/102; B08B 3/12; H01L 21/67051; H01L 41/00; H01L 41/04; H01L 41/08
USPC .............. 134/25.5, 32, 33, 42, 144, 147, 148, 134/151, 153, 157, 180, 181, 184, 185, 198
See application file for complete search history.

(56) References Cited

U.S. PATENT DOCUMENTS

| | | | |
|---|---|---|---|
| 2005/0212837 A1* | 9/2005 | Nakagawa et al. | 347/8 |
| 2006/0081269 A1 | 4/2006 | Kim et al. | |
| 2007/0169793 A1 | 7/2007 | Shimada et al. | |
| 2007/0289535 A1 | 12/2007 | Umeda | 118/724 |
| 2011/0031326 A1 | 2/2011 | Sato | |
| 2013/0247943 A1* | 9/2013 | Sato | 134/144 |
| 2013/0327365 A1* | 12/2013 | Sato | 134/34 |

FOREIGN PATENT DOCUMENTS

| | | |
|---|---|---|
| CN | 101088146 A | 12/2007 |
| JP | 2007-038089 | 2/2007 |
| JP | 2007-227878 | 9/2007 |
| JP | 2010-056376 | 3/2010 |
| JP | 2011-29315 | 2/2011 |
| KR | 10-2005-0035318 | 4/2005 |

* cited by examiner

*Primary Examiner* — Bibi Carrillo
(74) *Attorney, Agent, or Firm* — Ostrolenk Faber LLP

(57) ABSTRACT

A nozzle for discharging droplets of a processing liquid for processing a substrate has a main body including a supply port, a drain port, a processing liquid flow passageway connecting the supply port and the drain port, and a plurality of discharge ports from which the processing liquid is discharged. The processing liquid flow passageway includes a plurality of branch flow channels, which branch out between the supply port and the drain port and collect together between the supply port and the drain port. The plurality of discharge ports form a plurality of columns respectively corresponding to the plurality of branch flow channels; and are aligned along and connected to the corresponding branch flow channels. A piezo element applies vibration to the processing liquid flowing through the plurality of branch flow channels.

3 Claims, 8 Drawing Sheets

FIRST COVER RINSE PROCESS

CLEANING PROCESS AND
SECOND COVER RINSE PROCESS

RINSE PROCESS

DRYING PROCESS

NOZZLE, SUBSTRATE PROCESSING APPARATUS, AND SUBSTRATE PROCESSING METHOD

BACKGROUND OF THE INVENTION

1. Field of the Invention

This invention relates to a nozzle that discharges droplets of a processing liquid for processing substrate, a substrate processing apparatus that includes the nozzle, and a substrate processing method that uses the nozzle. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, substrates for solar cells, etc.

2. Description of Related Art

In a production process of a semiconductor device or a liquid crystal display device, etc., a cleaning process is performed to remove particles and other foreign substances from a substrate, such as a semiconductor wafer, a glass substrate for liquid crystal display device, etc. For example, each of Japanese Unexamined Patent Application Publication No. 2007-227878 and Japanese Unexamined Patent Application Publication No. 2010-56376 discloses a substrate processing apparatus of the single-substrate treatment type that cleans a substrate by making droplets of a processing liquid collide against the substrate.

The substrate processing apparatus described in Japanese Unexamined Patent Application Publication No. 2007-227878 includes a two-fluid nozzle that forms droplets of a processing liquid by making the processing liquid collide with a gas. The two-fluid nozzle includes a casing in which a processing liquid discharge port and a gas discharge port are formed. When the processing liquid and the gas are discharged at the same time from the processing liquid discharge port and the gas discharge port, respectively, the processing liquid and the gas collide in a vicinity of the casing, and droplets of the processing liquid are thereby formed.

The substrate processing apparatus described in Japanese Unexamined Patent Application Publication No. 2010-56376 includes a cleaning nozzle that forms droplets of the processing liquid by applying vibration to the processing liquid. The cleaning nozzle includes a tubular body having a plurality of discharge ports formed therein and a piezo element mounted to the tubular body. The processing liquid is supplied at a pressure of no more than 10 MPa to an interior of the tubular body. When an AC voltage is applied to the piezo element, vibration is applied to the processing liquid inside the tubular body and droplets of the processing liquid are sprayed from the plurality of discharge ports.

In cleaning a substrate by making droplets of a processing liquid collide against the substrate, it is preferable for a large number of the droplets to be sprayed from a nozzle. That is, the greater a number of times of collision of droplets against the substrate, the higher a probability of collision against foreign substances attached to the substrate and the higher a removal effect, and satisfactory cleaning can thus be performed when the number of droplets sprayed from the nozzle is large. Further, with a larger number of droplets, the same cleaning process can be performed in a shorter time and thus a number of substrates processed per time can be increased. Also, in cleaning a substrate by making droplets of the processing liquid collide against the substrate, it is preferable for a variation in size (particle diameter) of droplets and a variation in speed of the droplets to be small. That is, when the variation in particle diameter and/or the variation in speed are or is large, non-uniformity of cleaning may occur or a device pattern formed on the substrate may become damaged and the device pattern may become destroyed.

With the two-fluid nozzle described above, the droplets of the processing liquid are formed by making the processing liquid and the gas collide. It is thus difficult to control the particle diameter and the speed. On the other hand, with the cleaning nozzle described in Japanese Unexamined Patent Application Publication No. 2010-56376, the variation of particle diameter and the variation of speed can be suppressed by controlling the pressure of the processing liquid supplied to the cleaning nozzle and the vibration of the piezo element. Satisfactory cleaning can thus be performed.

However, with the cleaning nozzle described in Japanese Unexamined Patent Application Publication No. 2010-56376, a high pressure is required to spray droplets of high speed from small holes and thus the processing liquid is supplied to the interior of the tubular body at a pressure of 10 MPa at the maximum. Thus, for example, a tubular body with adequate thickness must be used to secure strength enabling withstanding of the liquid pressure in the cleaning nozzle. However, if the thickness of the tubular body is large, the cleaning nozzle is made large. The cleaning nozzle is installed in a limited space inside the substrate processing apparatus and is thus preferably compact.

SUMMARY OF THE INVENTION

An object of the present invention is to provide a nozzle that enables suppression of variation in size and speed of droplets of a processing liquid sprayed from the nozzle and can suppress enlargement of the nozzle, and to provide a substrate processing apparatus that includes the nozzle and a substrate processing method using such a nozzle.

Another object of the present invention is to provide a substrate processing apparatus and a substrate processing method that enables an entire surface of a substrate to be cleaned adequately.

The present invention provides a nozzle that includes a main body and a piezo element and discharges droplets of a processing liquid for processing a substrate. The main body includes a supply port supplied with the processing liquid, a drain port from which the processing liquid supplied to the supply port is drained, a processing liquid flow passageway connecting the supply port and the drain port, and a plurality of discharge ports from which the processing liquid is discharged. The processing liquid flow passageway includes a plurality of branch flow channels. The plurality of branch flow channels branch out between the supply port and the drain port and collect together between the supply port and the drain port. The plurality of discharge ports form a plurality of columns respectively corresponding to the plurality of branch flow channels. Further, the plurality of discharge ports are aligned along the corresponding branch flow channels and are connected to the corresponding branch flow channels. The piezo element applies vibration to the processing liquid flowing through the plurality of branch flow channels.

With the nozzle of the present arrangement, the processing liquid supplied to the supply port flows toward the drain port through the processing liquid flow passageway. The processing liquid flow passageway includes the plurality of branch flow channels. The processing liquid supplied to the branch flow channels is discharged from the plurality of discharge ports connected to the branch flow channels. The processing liquid discharged from the discharge port is disrupted by the vibration applied by the piezo element. A plurality of droplets of the processing liquid are thereby sprayed from the nozzle. Further, by the processing liquid supplied to the supply port being drained from the drain port, the processing liquid supplied to the processing liquid flow passageway can be suppressed or prevented reliably from being retained in the processing liquid flow passageway. Size and speed of the droplets of the processing liquid discharged from the discharge ports are controlled, for example, by pressure of the processing liquid supplied to the nozzle and vibration of the piezo element. The variation in size and speed of the droplets can thus be suppressed.

As mentioned above, the processing liquid flow passageway includes the plurality of branch flow channels. By branching of the processing liquid flow passageway, the processing liquid flow passageway can be increased in total length. A larger number of discharge ports can thereby be connected individually to the processing liquid flow passageway. A larger number of droplets can thereby be sprayed at the same time from the nozzle. For example, connecting of a larger number of discharge ports individually to the processing liquid flow passageway by increasing a flow path area (area of a cross section orthogonal to the processing liquid flow passageway) of the processing liquid flow passageway may be considered. However, if the flow path area of the processing liquid flow passageway increases, a force applied to the main body by the pressure of the processing liquid increases. The main body must thus be increased in strength, and the nozzle is thereby made large. Enlargement of the nozzle can thus be suppressed by branching the processing liquid flow passageway. Further, the plurality of discharge ports are aligned along the corresponding branch flow channels and thus increase in the flow path area can be suppressed, for example, in comparison to a case where the plurality of discharge ports are aligned in a direction orthogonal to the branch flow channels. Enlargement of the nozzle can thereby be suppressed.

The main body is preferably formed of a quartz-containing material. Quartz is higher in strength than, for example, a resin. Thus, by forming the main body from a quartz-containing material, enlargement of the nozzle can be suppressed while securing strength of the nozzle. Further, quartz has resistance against chemicals. Thus, by forming the main body from a quartz-containing material, corrosion of the nozzle can be suppressed or prevented.

The main body is not restricted to being formed of a quartz-containing material and may be formed of any one of resin-containing materials, metal-containing materials, and ceramic-containing materials. However, a resin is lower in strength than quartz and an adequate strength may not be secured in the nozzle. Also, in a case where the main body is formed of a metal-containing material, the metal may elute into the processing liquid flowing inside the nozzle, and the substrate may become contaminated by the metal dissolved in the processing liquid. Also, a ceramic is porous and thus in a case where the main body is formed of a ceramic-containing material, a portion of the main body may break off and a piece of the main body may be supplied to the substrate. It is thus preferable for the main body to be formed of a quartz-containing material.

Also preferably, the nozzle further includes a wiring connected to the piezo element and a cover covering both the piezo element and the wiring therewithin. With this arrangement, the piezo element and the wiring (electrical wiring) are protected by the cover. Thus, even in a case where the nozzle is used in a chemical solution atmosphere, exposure of the piezo element and the wiring to the chemical solution atmosphere can be suppressed or prevented. Corrosion of the piezo element and the wiring due to contact with the chemical solution can thus be suppressed or prevented.

Preferably, the main body further includes connection channels connecting the branch flow channels and the discharge ports. In this case, each connection channel preferably includes a reduced portion that reduces in flow path area as the discharge port is approached. Preferably, the flow path area of the reduced portion reduces in a continuous manner as the discharge port is approached.

With this arrangement, the processing liquid that flows through the branch flow channels is discharged from the discharge ports via the connection channels. The flow path area of the reduced portion provided in each connection channel reduces as the discharge port is approached. Lowering in pressure of the processing liquid in the connection channel can thereby be reduced. Pressure loss in the connection channel can thus be reduced. Also, in the case where the flow path area of the reduced portion reduces in a continuous manner, concentration of stress in the connection channel can be suppressed or prevented.

Also preferably, the processing liquid flow passageway and the connection channels are disposed in an interior of the main body and the main body includes a plurality of divided bodies that are joined to each other. With this arrangement, the main body is formed by joining the plurality of divided bodies. The plurality of divided bodies can thus be formed individually. The processing liquid flow passageway and the connection channels can thus be formed by joining the plurality of divided bodies having formed therein recess portions corresponding to the processing liquid flow passageway and the connection channels. The reduced portion provided in each connection channel is difficult to form from the discharge port side because the reduced portion reduces in flow path area as the discharge port is approached. On the other hand, before the joining of the plurality of divided bodies, the reduced portions can be formed from the branch flow channel side. The reduced portions can thus be formed readily.

The present invention also provides a substrate processing apparatus that includes a substrate holding unit holding a substrate, a nozzle with the above characteristics that discharges droplets of a processing liquid toward the substrate held by the substrate holding unit, a processing liquid supply unit supplying the processing liquid to the supply port of the nozzle, and a voltage applying unit applying voltage to the piezo element of the nozzle.

With the substrate processing apparatus with the above arrangement, a plurality of droplets of the processing liquid can be sprayed from the nozzle by supplying the processing liquid from the processing liquid supply unit to the nozzle and applying voltage to the piezo element by the voltage applying unit. The droplets of the processing liquid can thereby be made to collide against the substrate held by the substrate holding unit and foreign substances attached to the substrate can be removed physically by kinetic energy of the droplets. Further, for example, by controlling pressure of the processing liquid supplied to the nozzle and vibration of the piezo element, the variation in size and speed of the droplets can be suppressed. Satisfactory cleaning can thus be performed.

The substrate processing apparatus according to one embodiment of the present invention further includes a nozzle moving unit moving the nozzle along a locus, wherein the locus extends along a major surface of the substrate held by the substrate holding unit and passes through a center of the major surface when viewed from a perpendicular direction perpendicular to the major surface, and holding the nozzle so that the plurality of columns formed by the plurality of discharge ports intersect the locus when viewed from the perpendicular direction. The major surface of the substrate may be a front surface of the substrate that is a device forming surface or may be a rear surface of the substrate that is a non-device forming surface.

With this arrangement, the nozzle moving unit moves the nozzle along the locus that passes through the center of the major surface of the substrate when viewed from the direction perpendicular to the major surface. Further, the nozzle moving unit holds the nozzle so that when viewed from the direction perpendicular to the major surface of the substrate, the plurality of columns formed by the plurality of discharge ports intersect the locus. That is, when viewed from the direction perpendicular to the major surface of the substrate, all the columns intersect the locus. The droplets of the processing liquid sprayed from all the columns can thus be made to collide successively against a central portion of the major surface of the substrate by moving the nozzle along the locus while making the droplets of the processing liquid be sprayed from the nozzle. The central portion of the major surface of the substrate can thereby be cleaned satisfactorily.

The substrate processing apparatus may further include a control unit controlling the nozzle moving unit. In this case, the control unit may control the nozzle moving unit to move the nozzle along the locus so that, between a central position at which the nozzle overlaps with the center of the major surface when viewed from the perpendicular direction and a peripheral edge position at which the nozzle overlaps with a peripheral edge of the major surface when viewed from the perpendicular direction, the plurality of columns overlap successively with the center of the major surface when viewed from the perpendicular direction. Also, the control unit may control the nozzle moving unit to move the nozzle along the locus between a first peripheral edge position at which the nozzle overlaps with a peripheral edge of the major surface when viewed from the perpendicular direction and a second peripheral edge position, which is a position differing from the first peripheral edge position and at which the nozzle overlaps with a peripheral edge of the major surface when viewed from the perpendicular direction.

In both the case of moving the nozzle between the central position and the peripheral edge position and the case of moving the nozzle between the first peripheral edge position and the second peripheral edge position, the droplets of the processing liquid sprayed from all the columns can be made to collide successively against the central portion of the major surface of the substrate. The central portion of the major surface of the substrate can thereby be cleaned satisfactorily. Also, in the case of moving the nozzle between the central position and the peripheral edge position, a movement range of the nozzle is narrow in comparison to the case of moving the nozzle between the first peripheral edge position and the second peripheral edge position. Thus, by moving the nozzle between the central position and the peripheral edge position, space inside the substrate processing apparatus can be used effectively.

The present invention further provides a substrate processing method that includes a step of supplying a processing liquid to the supply port of the nozzle with the above-described characteristics in a state where the nozzle faces a major surface of a substrate and a step of applying voltage to the piezo element of the nozzle in parallel to the step of supplying the processing liquid. By this method, the same effects as the effects described in relation to the present invention of the substrate processing apparatus can be exhibited.

Also, the present invention provides a substrate processing apparatus that includes a substrate holding and rotating unit that holds and rotates a substrate, a nozzle having disposed therein a plurality of columns, in each of which a plurality of discharge ports discharging droplets of a processing liquid are aligned in a single column, and discharging the droplets of the processing liquid toward the substrate held by the substrate holding and rotating unit, and a nozzle holding and moving unit moving the nozzle along a locus, wherein the locus passes through a rotation center of a major surface of the substrate held by the substrate holding and rotating unit when viewed from a perpendicular direction perpendicular to the major surface, and holding the nozzle so that the plurality of columns intersect the locus when viewed from the perpendicular direction.

With this arrangement, the nozzle holding and moving unit moves the nozzle along the locus that passes through the center of the major surface of the substrate when viewed from the direction perpendicular to the major surface. Further, the nozzle holding and moving unit holds the nozzle so that, when viewed from the direction perpendicular to the major surface of the substrate, the plurality of columns formed by the plurality of discharge ports intersect the locus. That is, when viewed from the direction perpendicular to the major surface of the substrate, all the columns intersect the locus. The droplets of the processing liquid sprayed from all the columns can thus be made to collide against a central portion of the major surface of the substrate successively by moving the nozzle along the locus while making the droplets of the processing liquid be sprayed from the nozzle. The central portion of the major surface of the substrate can thereby be cleaned satisfactorily.

Japanese Unexamined Patent Application Publication No. 2011-29315 discloses a substrate processing apparatus that includes a cleaning head that forms droplets of a processing liquid by applying vibration to the processing liquid. The cleaning head includes a tubular body provided with a plurality of hole columns, in each of which a plurality of discharge holes are aligned in a single column, and a piezo element mounted to the tubular body. The processing liquid is supplied to an interior of the tubular body. When an AC voltage is applied to the piezo element, vibration is applied to the processing liquid inside the tubular body and droplets of the processing liquid are sprayed from the plurality of discharge holes. When a substrate cleaning process is performed with this substrate processing apparatus, the cleaning head is scanned between an upper side of a central portion and an upper side of an edge portion of the substrate while rotating the substrate. If in this process, the cleaning head is scanned in the same direction as a direction of alignment of the hole columns of the discharge holes provided in the cleaning head, then at the central portion of the substrate, only the droplets of the processing liquid discharged from a portion of the hole columns among the plurality of hole columns provided in the cleaning head are supplied to the central portion of the substrate and there are thus cases where the central portion of the substrate is not cleaned adequately.

The substrate processing apparatus described above provides a unit that resolves this issue and realizes a substrate processing apparatus that can adequately clean an entire surface of the substrate.

A control unit may further be included that controls the nozzle holding and moving unit to move the nozzle along the locus so that, between a central position at which the nozzle overlaps with the rotation center of the major surface when viewed from the perpendicular direction and a peripheral edge position at which the nozzle overlaps with a peripheral edge of the major surface when viewed from the perpendicular direction, the plurality of columns overlap successively with the rotation center of the major surface when viewed from the perpendicular direction.

With this arrangement, the droplets of the processing liquid sprayed from all the columns can be made to collide successively against the central portion of the major surface of the substrate. The central portion of the major surface of the substrate can thereby be cleaned satisfactorily. Also, in the case of moving the nozzle between the central position and the peripheral edge position, the movement range of the nozzle is narrow in comparison to the case of moving the nozzle between a first peripheral edge position and a second peripheral edge position that differs from the first peripheral edge position. Thus, by moving the nozzle between the central position and the peripheral edge position, space inside the substrate processing apparatus can be used effectively.

The nozzle may further include a main body having processing liquid flow channels, which are connected to the discharge ports and in which the processing liquid flows through along the columns, provided in respective correspondence to each of the plurality of columns and a piezo element applying vibration to the processing liquid flowing through the processing liquid flow channels, and a voltage applying unit that applies voltage to the piezo element may further be included.

With this arrangement, a plurality of droplets of the processing liquid can be sprayed from the nozzle by applying voltage to the piezo element by the voltage applying unit while making the processing liquid flow through the processing liquid flow channels. The droplets of the processing liquid can thereby be made to collide against the substrate held by the substrate holding unit and foreign substances attached to the substrate can be removed physically by the kinetic energy of the droplets. Further, for example, by controlling the pressure of the processing liquid supplied to the nozzle and the vibration of the piezo element, the variation in size and speed of the droplets can be suppressed. Satisfactory cleaning can thus be performed.

Further, the present invention provides a substrate processing method that includes a substrate holding and rotating step of holding and rotating a substrate and a nozzle moving step of moving a nozzle, having disposed therein a plurality of columns, in each of which a plurality of discharge ports discharging droplets of a processing liquid are aligned in a single column, and discharging the droplets of the processing liquid toward the substrate, along a locus passing through a rotation center of a major surface of the substrate when viewed from a perpendicular direction perpendicular to the major surface. In the nozzle moving step, the nozzle is held so that, when viewed from the perpendicular direction, the plurality of columns intersect the locus. An entire surface of the substrate can be cleaned adequately by this method.

In the nozzle moving step, the nozzle may be moved along the locus so that, between a central position at which the nozzle overlaps with the rotation center of the major surface when viewed from the perpendicular direction and a peripheral edge position at which the nozzle overlaps with a peripheral edge of the major surface when viewed from the perpendicular direction, the plurality of columns overlap successively with the rotation center of the major surface when viewed from the perpendicular direction.

The aforementioned and other objects, features, and effects of the present invention shall be clarified by the following description of embodiments given below with reference to the accompanying drawings.

DETAILED DESCRIPTION OF THE PREFERRED EMBODIMENTS

Figure 1:
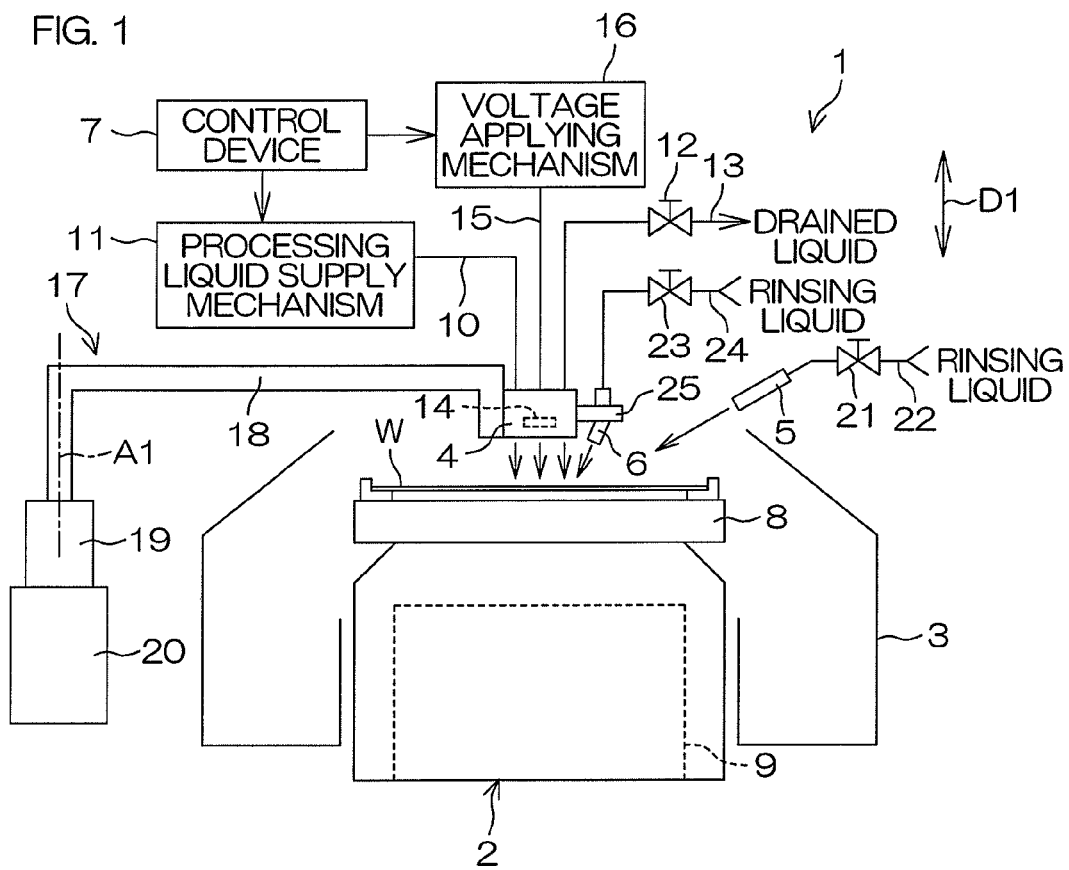
FIG. 1 is a schematic view of a general arrangement of a substrate processing apparatus according to a first embodiment of the present invention.

FIG. 1 is a schematic view of a general arrangement of a substrate processing apparatus 1 according to a first embodiment of the present invention.

Figure 2:
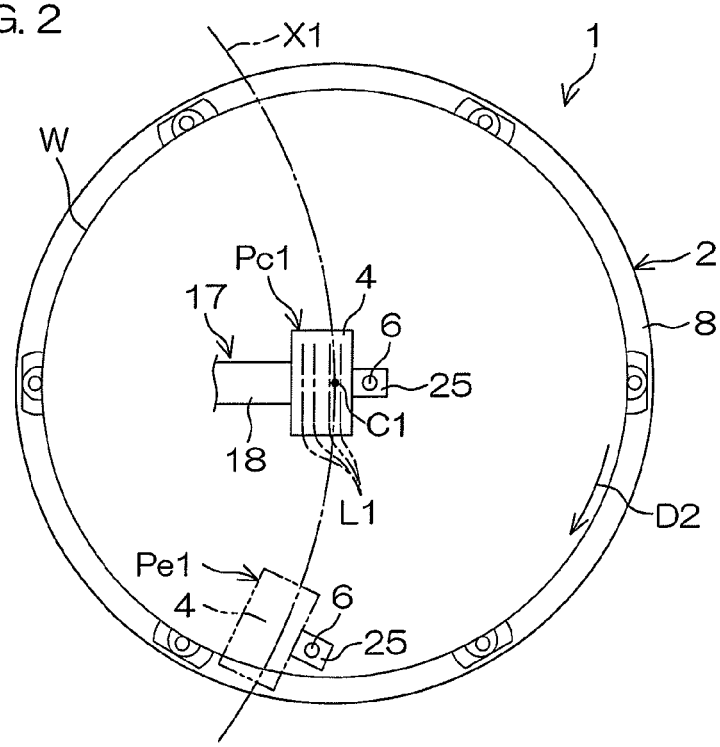
FIG. 2 is a plan view of a spray nozzle and an arrangement related thereto according to the first embodiment of the present invention.

FIG. 2 is a plan view of a spray nozzle 4 and an arrangement related thereto according to the first embodiment of the present invention.

The substrate processing apparatus 1 is a substrate processing apparatus of the single-substrate treatment type that processes circular substrates W, such as semiconductor wafers, one by one. The substrate processing apparatus 1 includes a spin chuck 2 (substrate holding unit, substrate holding and rotating unit) that horizontally holds and rotates a substrate W, a tubular cup 3 that surrounds the spin chuck 2, the spray nozzle 4 that supplies droplets of a processing liquid to the substrate W held by the spin chuck 2, a first rinsing liquid nozzle 5 and a second rinsing liquid nozzle 6 that supply a rinsing liquid to the substrate W held by the spin chuck 2, and a control device 7 (control unit) that controls operations of the spin chuck 2 and other devices included in the substrate processing apparatus 1 and controls opening and closing of valves. The spray nozzle 4 is an example of a nozzle according to the present invention.

The spin chuck 2 includes a spin base 8 that horizontally holds the substrate W and is capable of rotating the substrate W around a vertical axis passing through a center of the substrate W and a spin motor 9 that rotates the spin base 8 around the vertical axis. The spin chuck 2 may be a gripping type chuck that horizontally holds the substrate W by gripping the substrate W in a horizontal direction, or, alternatively, may be a vacuum-type chuck that horizontally holds the substrate W by suction of a rear surface (lower surface) of the substrate W, which is a non-device forming surface. In the first embodiment, the spin chuck 2 is a gripping type chuck. The spin motor 9 is controlled by the control device 7.

The spray nozzle 4 is arranged to spray a plurality of droplets of the processing liquid downwards. The spray nozzle 4 is connected to a processing liquid supply mechanism 11 (processing liquid supply unit) via a processing liquid supply pipe 10. Further, the spray nozzle 4 is connected to a processing liquid drain pipe 13 in which a drain valve 12 is interposed. The processing liquid supply mechanism 11 is, for example, a mechanism that includes a pump. The processing liquid supply mechanism 11 constantly supplies the processing liquid at a predetermined pressure (of, for example, no more than 10 MPa) to the spray nozzle 4. As examples of the processing liquid supplied from the processing liquid supply mechanism 11 to the spray nozzle 4, deionized water, carbonated water, a mixed liquid of ammonia water and hydrogen peroxide solution, etc., can be cited. By controlling the processing liquid supply mechanism 11, the control device 7 can change the pressure of the processing liquid supplied to the spray nozzle 4 to any pressure.

Also, as shown in FIG. 1, the spray nozzle 4 includes a piezo element 14 disposed in an interior of the spray nozzle 4. The piezo element 14 is connected to a voltage applying mechanism 16 (voltage applying unit) via a wiring 15. The voltage applying mechanism 16 is, for example, a mechanism that includes an inverter. The voltage applying mechanism 16 applies an AC voltage to the piezo element 14. When the AC voltage is applied to the piezo element 14, the piezo element 14 vibrates at a frequency corresponding to a frequency of the applied AC voltage. By controlling the voltage applying mechanism 16, the control device 7 can change the frequency of the AC voltage applied to the piezo element 14 to any frequency (for example, from several hundred (kHz to several MHz). The frequency of vibration of the piezo element 14 is thus controlled by the control device 7.

The substrate processing apparatus 1 further includes a nozzle moving mechanism 17 (nozzle holding and moving unit) that moves the spray nozzle 4. The nozzle moving mechanism 17 includes a nozzle arm 18 holding the spray nozzle 4, a rotating mechanism 19 connected to the nozzle arm 18, and a raising and lowering mechanism 20 connected to the rotating mechanism 19. The rotating mechanism 19 is, for example, a mechanism that includes a motor. The raising and lowering mechanism 20 is a mechanism that includes a ball screw mechanism and a motor that drives the ball screw mechanism. The rotating mechanism 19 rotates the nozzle arm 18 around a vertical rotational axis A1 disposed at a periphery of the spin chuck 2. The spray nozzle 4 is rotated around the rotational axis A1 together with the nozzle arm 18. The spray nozzle 4 is thereby moved in a horizontal direction. The raising and lowering mechanism 20 raises and lowers the rotating mechanism 19 in a vertical direction D1. The spray nozzle 4 and the nozzle arm 18 are raised and lowered in the vertical direction D1 together with the rotating mechanism 19. The spray nozzle 4 is thereby moved in the vertical direction D1.

The rotating mechanism 19 moves the spray nozzle 4 horizontally within a horizontal plane that includes a region above the spin chuck 2 and a position separated from the region above the spin chuck 2. Further, as shown in FIG. 2, the rotating mechanism 19 moves the spray nozzle 4 horizontally along an arcuate locus X1 extending along an upper surface of the substrate W held by the spin chuck 2. The locus X1 is a curve that joins two non-overlapping positions on the upper surface of the substrate W when viewed from a perpendicular direction perpendicular to the upper surface of the substrate W held by the spin chuck 2 (the vertical direction D1 in the first embodiment) and passes through a center C1 of the upper surface of the substrate W when viewed from the vertical direction D1. In a state where the spray nozzle 4 is positioned above the substrate W held by the spin chuck 2, the raising and lowering mechanism 20 lowers the spray nozzle 4, so that the spray nozzle 4 is moved close to the upper surface of the substrate W. When droplets of the processing liquid sprayed from the spray nozzle 4 are to be supplied to the substrate W, the control device 7 controls the rotating mechanism 19 to move the spray nozzle 4 horizontally along the locus X1 with the spray nozzle 4 being disposed close to the upper surface of the substrate W.

As shown in FIG. 1, the first rinsing liquid nozzle 5 is connected to a first rinsing liquid supply pipe 22 in which a first rinsing liquid valve 21 is interposed. Supplying of the rinsing liquid to the first rinsing liquid nozzle 5 is controlled by opening and closing of the first rinsing liquid valve 21. The rinsing liquid supplied to the first rinsing liquid nozzle 5 is discharged toward an upper surface central portion of the substrate W held by the spin chuck 2. The second rinsing liquid 6 is connected to a second rinsing liquid supply pipe 24 in which a second rinsing liquid valve 23 is interposed. Supplying of the rinsing liquid to the second rinsing liquid nozzle 6 is controlled by opening and closing of the second rinsing liquid valve 23. The rinsing liquid supplied to the second rinsing liquid nozzle 6 is discharged downward from the second rinsing liquid nozzle 6. As examples of the rinsing liquid supplied to the first rinsing liquid nozzle 5 and the second rinsing liquid nozzle 6, deionized water, carbonated water, electrolyzed ion water, hydrogen water, ozone water, and aqueous hydrochloric acid of dilute concentration (for example of about 10 to 100 ppm) can be cited.

The second rinsing liquid nozzle 6 is fixed to the spray nozzle 4 by a stay 25. The second rinsing liquid nozzle 6 is moved together with the spray nozzle 4 in the horizontal direction and the vertical direction D1. The second rinsing liquid nozzle 6 is thus moved horizontally along the locus X1 together with the spray nozzle 4. As shown in FIG. 2, the spray nozzle 4 and the second rinsing liquid nozzle 6 are aligned in a rotation direction D2 of the substrate W by the spin chuck 2. The rinsing liquid supplied to the second rinsing liquid nozzle 6 may be discharged toward a region below the spray nozzle 4 or may be supplied to a position, which, in regard to the rotation direction D2 of the substrate W, is located upstream and close to a supply position to which the droplets of the processing liquid are supplied from the spray nozzle 4 to the upper surface of the substrate W.

Figure 3:
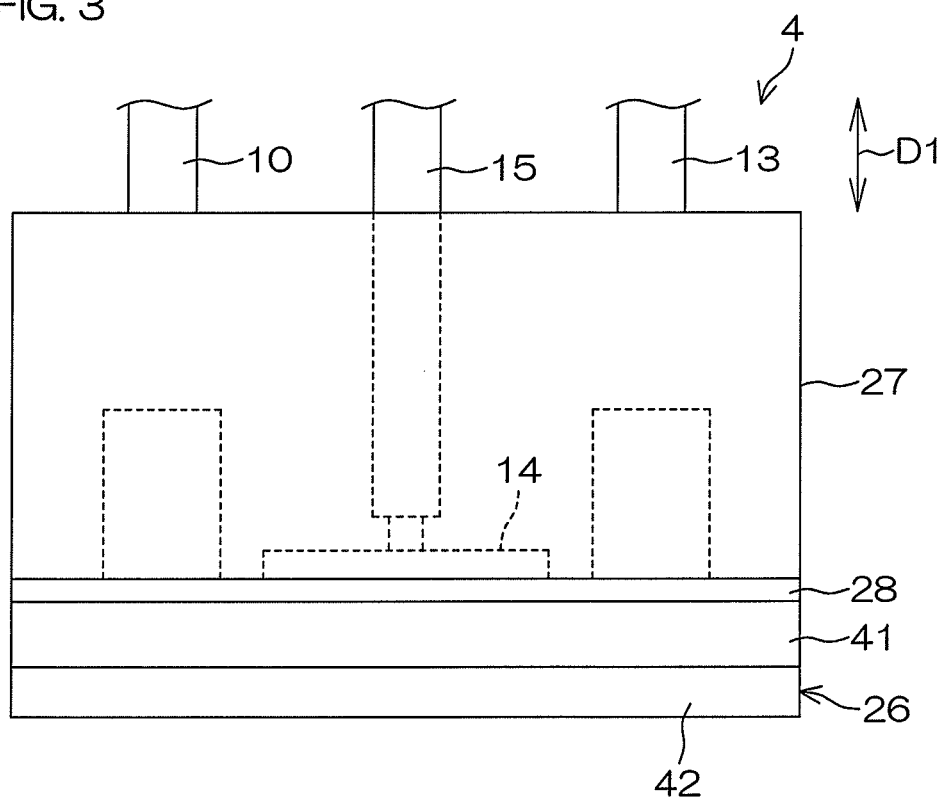
FIG. 3 is a schematic side view of the spray nozzle according to the first embodiment of the present invention.
Figure 4:
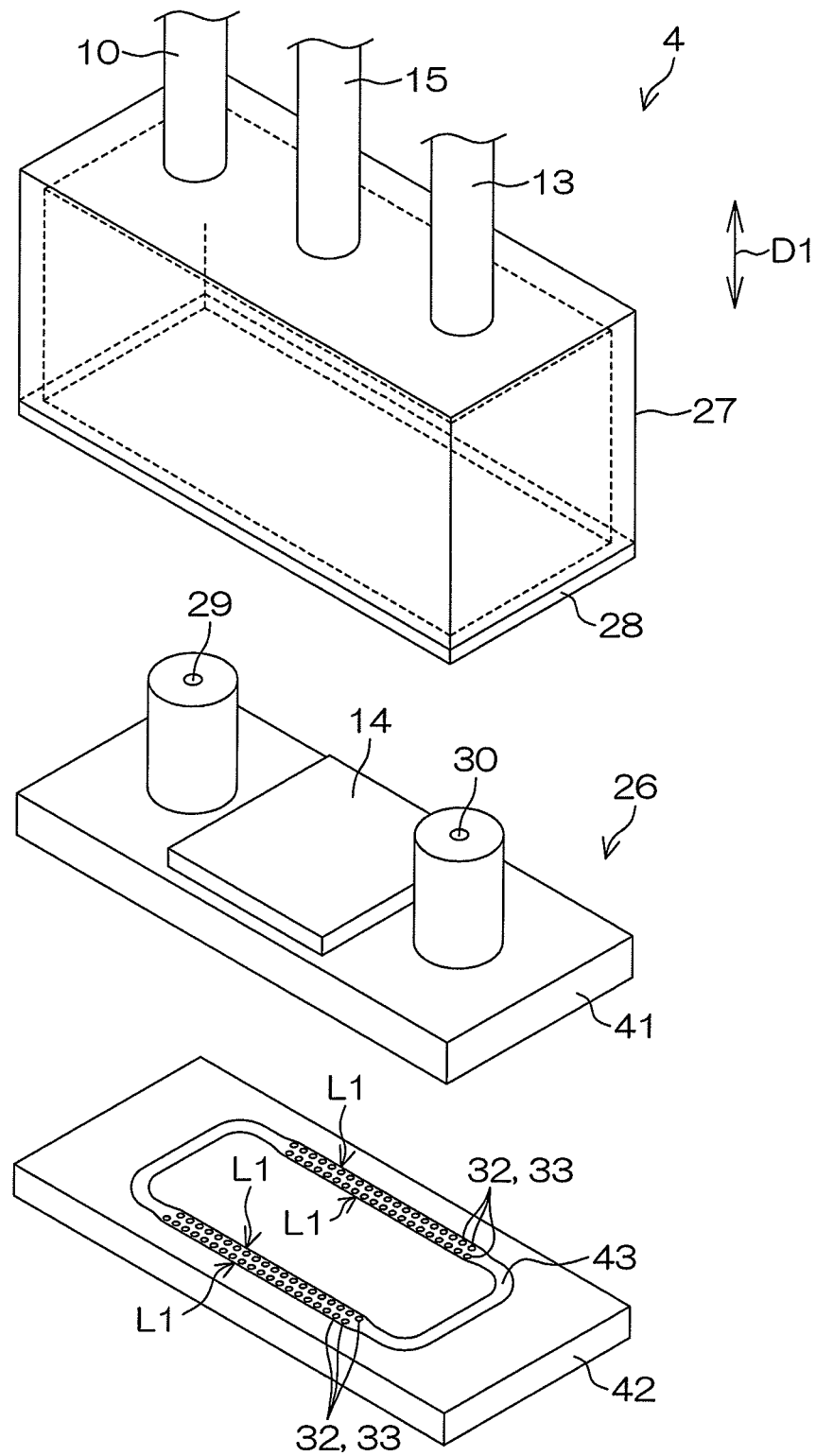
FIG. 4 is a schematic exploded perspective view of the spray nozzle according to the first embodiment of the present invention.

FIG. 3 is a schematic side view of the spray nozzle 4 according to the first embodiment of the present invention. FIG. 4 is a schematic exploded perspective view of the spray nozzle 4 according to the first embodiment of the present invention.

The spray nozzle 4 includes a main body 26 that discharges the droplets of the processing liquid, a cover 27 mounted to the main body 26, the piezo element 14 covered by the cover 27, and a seal 28 interposed between the main body 26 and the cover 27. The main body 26 and the cover 27 are both formed of a material with chemical resistance. In the first embodiment, the main body 26 is formed, for example, of quartz. The cover 27 is formed, for example, of a fluorine-based resin. The seal 28 is formed, for example, of a resin material with elasticity, such as EPDM (ethylene-propylene-diene rubber). The main body 26 has a strength capable of withstanding a high pressure. The piezo element 14 and a portion of the main body 26 are housed in an interior of the cover 27. An end portion of the wiring 15 is connected, for example by solder, within the cover 27, to the piezo element 14. The interior of the cover 27 is sealed by the seal 28.

Figure 5:
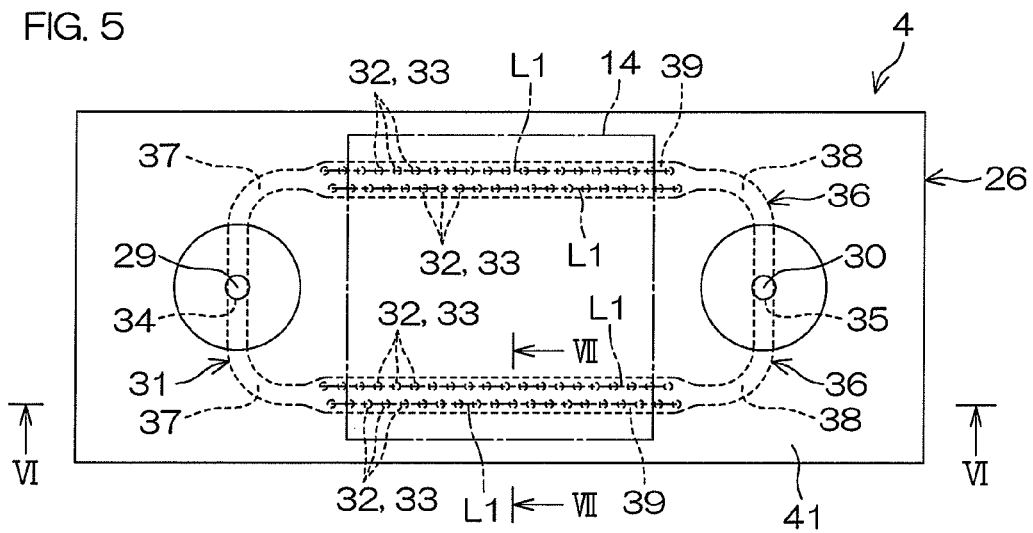
FIG. 5 is a plan view for explaining an arrangement of a main body included in the spray nozzle according to the first embodiment of the present invention.
Figure 6:
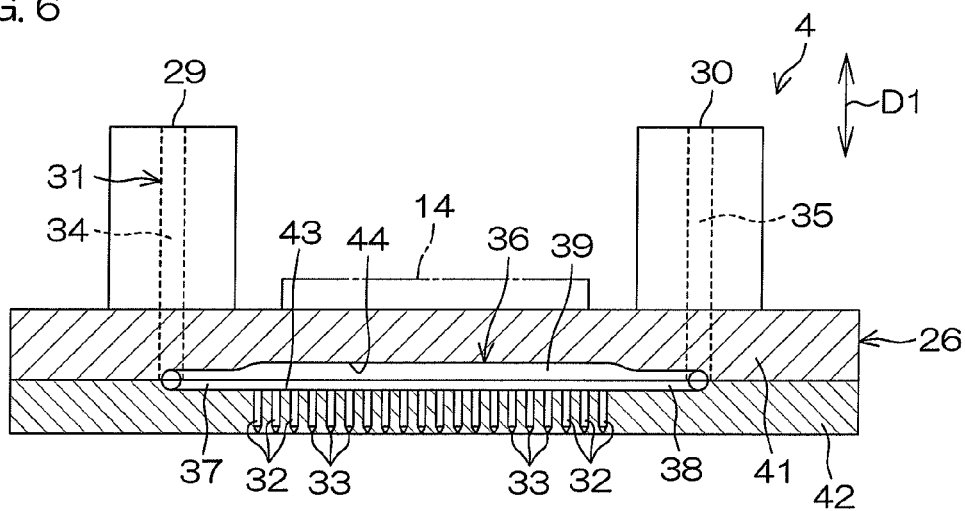
FIG. 6 is a sectional view of the main body taken along the line VI-VI in FIG. 5.
Figure 7:
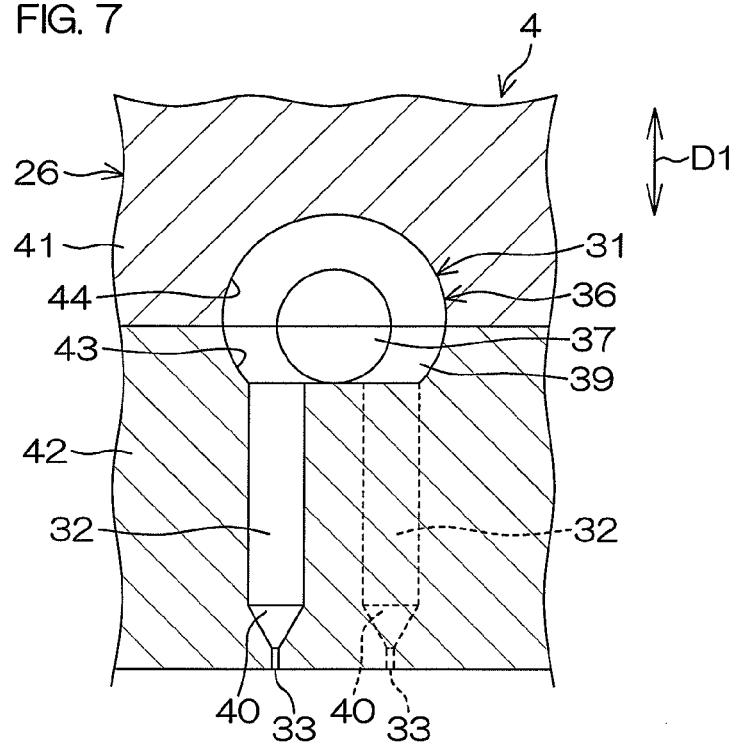
FIG. 7 is a sectional view of the main body taken along the line VII-VII in FIG. 5.
Figure 8:
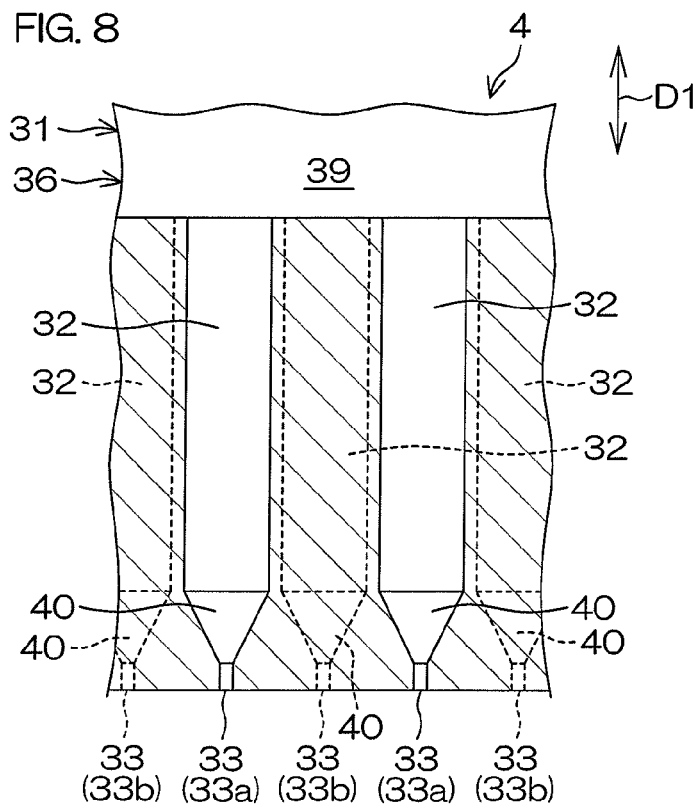
FIG. 8 is a partially enlarged view of FIG. 6.

FIG. 5 is a plan view for explaining an arrangement of the main body 26 included in the spray nozzle 4 according to the first embodiment of the present invention. FIG. 6 is a sectional view of the main body 26 taken along the line VI-VI in FIG. 5. FIG. 7 is a sectional view of the main body 26 taken along the line VII-VII in FIG. 5. FIG. 8 is a partially enlarged view of FIG. 6. FIG. 5 and FIG. 6 shall be referenced in the following description. Also, FIG. 1, FIG. 2, FIG. 4, FIG. 7, and FIG. 8 shall be referenced where suitable in the following description.

The main body 26 includes a supply port 29 supplied with the processing liquid, a drain port 30 from which the processing liquid supplied to the supply port 29 is drained, a processing liquid flow passageway 31 connecting the supply port 29 and the drain port 30, a plurality of connection channels 32 connected to the processing liquid flow passageway 31, and a plurality of discharge ports 33 connected respectively to the plurality of connection channels 32. The processing liquid flow passageway 31 and the connection channels 32 are disposed in an interior of the main body 26. The supply port 29, the drain port 30, and the discharge ports 33 open at surfaces of the main body 26. The supply port 29 and the drain port 30 are positioned higher than the discharge ports 33. A lower surface of the main body 26 is, for example, a flat surface, and the discharge ports 33 open at the lower surface of the main body 26. The processing liquid supply pipe 10 and the processing liquid drain pipe 13 are connected to the supply port 29 and the drain port 30, respectively. The processing liquid flowing through the processing liquid supply pipe 10 is supplied to the supply port 29. The processing liquid discharged from the drain port 30 is drained into the processing liquid drain pipe 13.

The processing liquid flow passageway 31 includes an upstream side collecting flow channel 34 connected to the supply port 29, a downstream side collecting flow channel 35 connected to the discharge port 30, and two branch flow channels 36 (processing liquid flow channels) connected to the upstream side collecting flow channel 34 and the downstream side collecting flow channel 35. The upstream side collecting flow channel 34 and the downstream side collecting flow channel 35 extend vertically downward from the supply port 29 and the drain port 30, respectively. One end of each branch flow channel 36 is connected to a lower end of the upstream side collecting flow channel 34 and the other end of each branch flow channel 36 is connected to a lower end of the downstream side collecting flow channel 35. The lower end of the upstream side collecting flow channel 34 is a branching position and a lower end of the downstream side collecting flow channel 35 is a collecting position. The two branch flow channels 36 extend horizontally from the branching position to the collecting position. As shown in FIG. 5, the two branch flow channels 36 take on a rectangular shape in a plan view having four arcuate corner portions that are outwardly convex. The two branch flow channels 36 are orthogonal to the upstream side collecting flow channel 34 and the downstream side collecting flow channel 35. With the exception of middle portions 39 to be described later, a cross-sectional shape of the processing liquid flow passageway 31 is, for example, a circular shape with a diameter of no more than several mm.

Each branch flow channel 36 includes an upstream portion 37 connected to the lower end of the upstream side collecting flow channel 34, a downstream portion 38 connected to the lower end of the downstream side collecting flow channel 35, and the middle portion 39 connected to the upstream portion 37 and the downstream portion 38. As shown in FIG. 5, the two upstream portions 37 extend to mutually opposite sides from the lower end of the upstream side collecting flow channel 34. Likewise, the two downstream portions 37 extend to mutually opposite sides from the lower end of the downstream side collecting flow channel 35. Each middle portion 39 extends rectilinearly from the upstream portion 37 to the downstream portion 38. The two middle portions 39 are parallel. Each middle portion 39 is not restricted to being rectilinear and may extend curvingly. At least a portion of each middle portion 39 is positioned below the piezo element 14. Vibration from the piezo element 14 is applied to the processing liquid flowing through each middle portion 39. In addition, a flow path area of the middle portion 39 is larger than the flow path areas of the upstream positions 37 and the downstream positions 38. The middle portions 39 are connected to the upstream portions 37 and the downstream portions 38 in a manner such that the flow path area changes in a continuous manner. As shown in FIG. 7, each middle portion 39 has a cross-sectional shape of elliptical form that is long in the horizontal direction (cross-sectional shape orthogonal to the middle portion 39). Each middle portion 39 is connected to a plurality of connection channels 32.

As shown in FIG. 6, each connection channel 32 extends vertically downward from a lower portion of the middle portion 39. The connection channels 32 are orthogonal to the middle portion 39. Each discharge port 32 is connected to one of either branch flow channel 36 via a connection channel 32. The cross-sectional shape of each connection channel 32 is, for example, a circular shape with a diameter of no more than several mm. Each discharge port 33 is a microscopic hole having a diameter of several μm to several dozen μm. The flow path area of each connection channel 32 is smaller than the flow path area of the branch flow channel 36. The flow path area of each discharge port 33 is smaller than the flow path area of the connection channel 32. As shown in FIG. 7, each connection channel 32 includes a conical reduced portion 40 that reduces continuously in flow path area as the discharge port 33 is approached. The discharge port 33 is connected to a lower end of the reduced portion 40 that corresponds to a lower end of the connection channel 32. A connection channel 32 and a discharge port 33 that correspond to each other are coaxial. As shown in FIG. 5, the plurality of discharge ports 33 connected to the same branch flow channel 36 form two columns L1. Thus, in the first embodiment, the plurality of discharge ports 33 form four columns L1.

Each column L1 is formed from several (for example, no less than ten) discharge ports 33. Each column L1 extends rectilinearly along the corresponding branch flow channel 36. Each column L1 is not restricted to being rectilinear and may extend curvingly. The four columns L1 are parallel. Two columns L1 corresponding to the same branch flow channel 36 are adjacent to each other. An interval between such two columns L1 is, for example, no more than several mm. The plurality of discharge ports 33 making up the same column L1 are aligned at equal intervals. An interval between two adjacent discharge ports 33 in the same column L1 is, for example, no more than several mm and is constant in all the columns L1. As shown in FIG. 8, in two columns L1 corresponding to the same branch flow channel 36, the plurality of discharge ports 33 making up one column L1 (discharge ports 33a in FIG. 8) and the plurality of discharge ports 33 making up the other column L1 (discharge ports 33b in FIG. 8) are disposed in an alternating manner when viewed from a horizontal direction orthogonal to the two columns L1. Thus, as shown in FIG. 5, the two columns L1 corresponding to the same branch flow channel 36 are shifted in a longitudinal direction of the branch flow channel 36.

As shown in FIG. 2, the nozzle moving mechanism 17 moves the spray nozzle 4 horizontally along the arcuate locus X1. The nozzle arm 18 holds the spray nozzle 4 so that, when viewed from the vertical direction D1, one of the middle portions 39 lies along a tangent to the locus X1. The two columns L1 corresponding to the one middle portion 39 thus extend along the tangent to the locus X1. The other middle portion 39 is disposed at an inner side or an outer side of the locus X1. When the nozzle moving mechanism 17 moves the spray nozzle 4 horizontally along the locus X1, the two columns L1 corresponding to the one middle portion 39 move along the locus X1.

Also, as shown in FIG. 4, the main body 26 includes an upper divided body 41 (divided body) and a lower divided body 42 (divided body). Both the upper divided body 41 and the lower divided body 42 are formed of quartz. The upper divided body 41 is disposed above the lower divided body 42. The upper divided body 41 and the lower divided body 42 are joined to each other, for example, by welding. The plurality of branch flow channels 36 are formed between the upper divided body 41 and the lower divided body 42. That is, as shown in FIG. 6, a lower recess portion 43 that is recessed downward from an upper surface of the lower divided body 42 is formed in an upper surface of the lower divided body 42, and an upper recess portion 44 that is recessed upward from a lower surface of the upper divided body 42 is formed in a lower surface of the upper divided body 41. The upper divided body 41 and the lower divided body 42 are joined to each other in a state where the upper recess portion 44 and the lower recess portion 43 overlap vertically. The processing liquid flow passageway 31 and the connection channels 32 are formed by the upper recess portion 44 and the lower recess portion 43.

The processing liquid supply mechanism 11 (see FIG. 1) constantly supplies the processing liquid at a high pressure to the spray nozzle 4. The processing liquid supplied to the supply port 29 from the processing liquid supply mechanism 11 via the processing liquid supply pipe 10 is supplied to the processing liquid flow passageway 31. In a state where the drain valve 12 (see FIG. 1) is closed, the pressure (liquid pressure) of the processing liquid in the processing liquid flow passageway 31 increases adequately. Thus, in the state where the drain valve 12 is closed, the processing liquid is sprayed from the respective discharge ports 33 by the liquid pressure. Further, when in the state where the drain valve 12 is closed, the AC voltage is applied to the piezo element 14, the vibration of the piezo element 14 is applied to the processing liquid flowing through the branch flow channels 16, and the processing liquid sprayed from the respective discharge ports 33 is disrupted by the vibration. Thus, when the AC voltage is applied to the piezo element 14 in the state where the drain valve 12 is closed, droplets of the processing liquid are sprayed from the respective discharge ports 33. Numerous droplets of the processing liquid of uniform particle diameter are thereby sprayed simultaneously at uniform speed.

On the other hand, when the drain valve 12 is open, the processing liquid supplied to the processing liquid flow passageway 31 is drained from the drain port 30 to the processing liquid drain pipe 13. Also, pressure loss at portions of connection of the connection channels 32 and the discharge ports 33 is large because the discharge ports 33 are extremely small in diameter. In the state where the drain valve 12 is open, the liquid pressure in the processing liquid flow passageway 31 does not rise adequately. Thus, in the state where the drain valve 12 is open, the processing liquid supplied to the processing liquid flow passageway 31 is drained to the processing liquid drain pipe 13 from the drain port 30 and the processing liquid is not discharged from the plurality of discharge ports 33. The discharge of the processing liquid from the discharge ports 33 is thus controlled by the opening and closing of the drain valve 12. The control device 7 opens the drain valve 12 while the spray nozzle 4 is not used for processing the substrate W (during standby of the spray nozzle 4). A state where the processing liquid flows through the interior of the spray nozzle 4 is thus maintained even during standby of the spray nozzle 4.

Figure 9A:
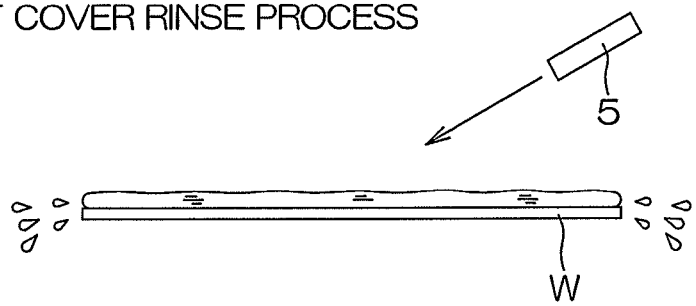
FIG. 9A to FIG. 9D are diagrams for describing a processing example of a substrate performed by the substrate processing apparatus according to the first embodiment of the present invention.
Figure 9B:
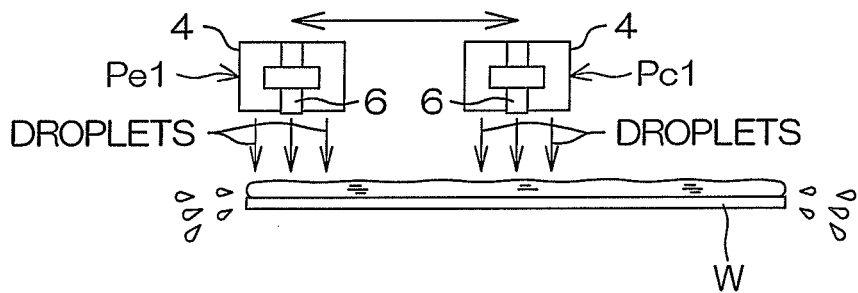
Figure 9C:
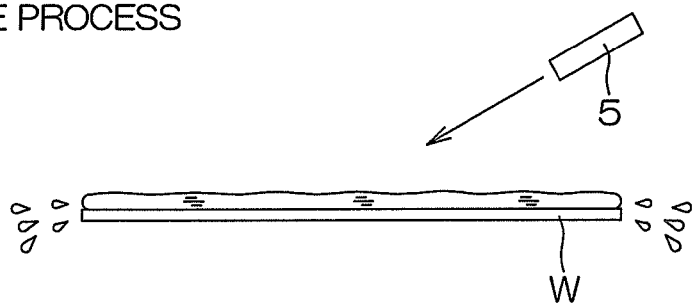
Figure 9D:
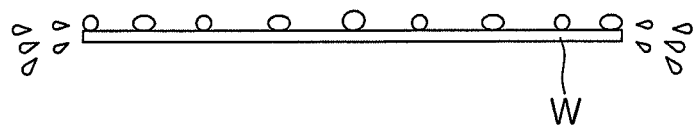
Figure 10:
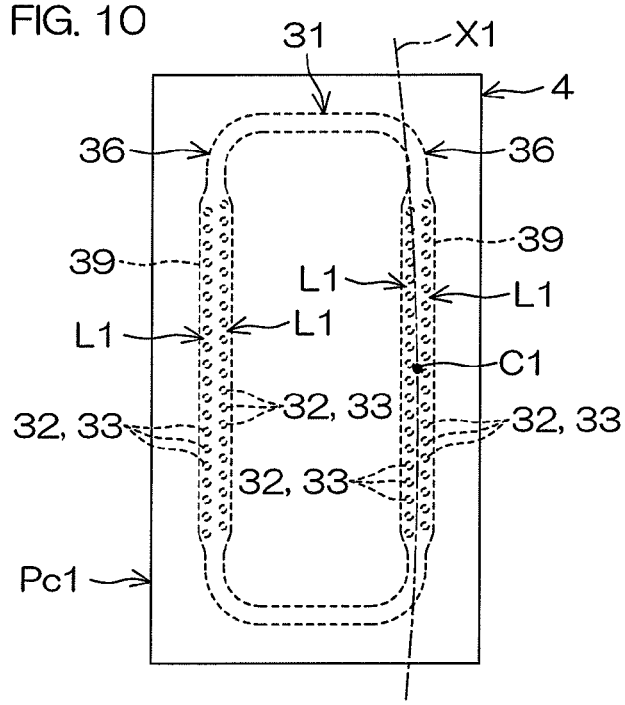
FIG. 10 is a plan view of a state where the spray nozzle is positioned at a central position.

FIG. 9A to FIG. 9D are diagrams for describing a processing example of a substrate W performed by the substrate processing apparatus 1 according to the first embodiment of the present invention. FIG. 10 is a plan view of a state where the spray nozzle 4 is positioned at a central position Pc1. FIG. 1 and FIG. 9A to FIG. 9D shall be referenced in the following description. Also, FIG. 2 and FIG. 10 shall be referenced where suitable in the following description.

An unprocessed substrate W is conveyed by an unillustrated conveying robot and placed on the spin chuck 2 with a front surface, which is a device forming surface, being faced upward. The control device 7 then controls the spin chuck 2 and makes spin chuck 2 hold the substrate W. Thereafter, the control device 7 controls the spin motor 9 to rotate the substrate W held by the spin chuck 2. When the substrate W is being conveyed onto the spin chuck 2, the control device 7 controls the spray nozzle 4, etc., to be withdrawn from above the spin chuck 2.

A first cover rinse process of supplying deionized water, which is one example of the rinsing liquid, from the first rinsing liquid nozzle 5 to the substrate W and covering the upper surface of the substrate W with deionized water is then performed. Specifically, while making the spin chuck 2 rotate the substrate W, the control device 7 opens the first rinsing liquid valve 21 to make deionized water be discharged from the first rinsing liquid nozzle 5 onto the upper surface central portion of the substrate W held by the spin chuck 2 as shown in FIG. 9A. The deionized water discharged from the first rinsing liquid nozzle 5 is supplied to the upper surface central portion of the substrate W and spreads to outer sides along the upper surface of the substrate W upon receiving a centrifugal force due to the rotation of the substrate W. Deionized water is thereby supplied to the entire upper surface of the substrate W and the entire upper surface of the substrate W is covered by deionized water. After elapse of a predetermined time from the opening of the first rinsing liquid valve 21, the control device 7 closes the first rinsing liquid valve 21 and stops the discharging of deionized water from the first rinsing liquid nozzle 5.

Next, a cleaning process of supplying droplets of deionized water, which is an example of the processing liquid, from the spray nozzle 4 to the substrate W and cleaning the substrate W and a second cover rinse process of supplying deionized water, which is one example of the rinsing liquid, from the second rinsing liquid nozzle 6 to the substrate W and covering the upper surface of the substrate W with deionized water are performed in parallel. Specifically, the control device 7 controls the nozzle moving mechanism 17 to move the spray nozzle 4 to above the spin chuck 2 and bring the spray nozzle 4 close to the upper surface of the substrate W. Thereafter, while making the spin chuck 2 rotate the substrate W, the control device 7 opens the second rinsing liquid valve 23 to make deionized water be discharged from the second rinsing liquid nozzle 6 toward the region below the spray nozzle 4 as shown in FIG. 9B. In this state, the control device 7 closes the drain valve 12 and controls the voltage applying mechanism 16 and applies the AC voltage of the predetermined frequency to the piezo element 14 of the spray nozzle 4.

The control device 7 controls the nozzle moving mechanism 17 to move the spray nozzle 4 horizontally along the locus X1 with the drain valve 12 being closed and the AC voltage of the predetermined frequency being applied to the piezo element 14. Specifically, as shown in FIG. 2 and FIG. 9B, the control device 7 makes the spray nozzle 4 reciprocate between the central position Pc1 and a peripheral edge position Pe1 a plurality of times. The central position Pc1 is a position at which the spray nozzle 4 overlaps with a center C1 of the upper surface of the substrate W when viewed from the vertical direction D1 and the peripheral edge position Pe1 is a position at which the spray nozzle 4 and a peripheral edge of the substrate W overlap when viewed from the vertical direction D1. In the state where the spray nozzle 4 is positioned at the central position Pc1 as shown in FIG. 10, the one middle portion 39 and the center C1 of the upper surface of the substrate W overlap when viewed from the vertical direction D1. Further, in the state where the spray nozzle 4 is positioned between the central position Pc1 and the peripheral edge position Pe1 as shown in FIG. 2, the second rinsing liquid nozzle 6 is positioned at an upstream side of the spray nozzle 4 in relation to the rotation direction D2 of the substrate W. The control device 7 thus move the spray nozzle 4 in a range in which the second rinsing liquid nozzle 6 is positioned at the upstream side of the spray nozzle 4 in relation to the rotation direction D2 of the substrate W.

As mentioned above, when the AC voltage is applied to the piezo element 14 in the state where the drain valve 12 is closed, numerous droplets of deionized water are sprayed downward from the spray nozzle 4. The numerous droplets of deionized water are thereby supplied to the upper surface of the substrate W that is covered by deionized water. Thus, by the nozzle moving mechanism 17 moving the spray nozzle 4 between the central position Pc1 and the peripheral edge position Pe1, the numerous droplets sprayed from the spray nozzle 4 are supplied across the entire upper surface of the substrate W. Also, the deionized water supplied by the second rinsing liquid nozzle 6 is discharged toward the region below the spray nozzle 4. The droplets of deionized water sprayed from the spray nozzle 4 are thus sprayed onto a portion of the upper surface of the substrate W that is covered by the deionized water discharged from the second rinsing liquid nozzle 6. The numerous droplets sprayed from the spray nozzle 4 thus collide against the upper surface of the substrate W that is covered by deionized water.

Particles and other foreign substances attached to the upper surface of the substrate W are physically removed by kinetic energy of the droplets sprayed onto the upper surface of the substrate W. The upper surface of the substrate W is thereby cleaned. Further, droplets of deionized water are sprayed onto the upper surface of the substrate W that is covered by deionized water and thus damaging of the upper surface of the substrate W is suppressed or prevented. Yet further, droplets of deionized water are sprayed onto the upper surface of the substrate W that is covered by deionized water and thus foreign substances removed from the upper surface of the substrate W by collision of the droplets can be suppressed or prevented from reattaching to the upper surface of the substrate W. When the cleaning process and the second cover rinse process have been performed for a predetermined time, the control device 7 opens the drain valve 12 and at the same time closes the second rinsing liquid valve 23 to stop the discharge of deionized water from the spray nozzle 4 and the second rinsing liquid nozzle 6.

Next, a rinse process of supplying deionized water, which is an example of the rinsing liquid, from the first rinsing liquid nozzle 5 to the substrate W is performed to rinse off the deionized water attached to the substrate W or a chemical solution attached to the substrate W in a case where a chemical solution is discharged as the rinsing liquid from the second rinsing liquid nozzle 6. Specifically, while making the spin chuck 2 rotate the substrate W, the control device 7 opens the first rinsing liquid valve 21 to make deionized water be discharged from the first rinsing liquid nozzle 5 onto the upper surface central portion of the substrate W held by the spin chuck 2 as shown in FIG. 9C. The deionized water discharged from the first rinsing liquid nozzle 5 is supplied to the upper surface central portion of the substrate W and spreads to outer sides along the upper surface of the substrate W upon receiving a centrifugal force due to the rotation of the substrate W. Deionized water is thereby supplied to the entire upper surface of the substrate W and the deionized water or chemical solution supplied to the substrate W from the spray nozzle 4 and the second rinsing liquid nozzle 6 is thereby rinsed off. After elapse of a predetermined time from the opening of the first rinsing liquid valve 21, the control device 7 closes the first rinsing liquid valve 21 and stops the discharging of deionized water from the first rinsing liquid nozzle 5.

Next, a drying process (spin drying) of drying the substrate W is performed. Specifically, the control device 7 controls the spin motor 9 to rotate the substrate W at a high rotation speed (for example, several thousand rpm). A large centrifugal force is thereby made to act on the deionized water attached to the substrate W and the deionized water attached to the substrate W is spun off to a periphery of the substrate W as shown in FIG. 9D. The deionized water is thereby removed from the substrate W and the substrate W dries. After the drying process has been performed for a predetermined time, the control device 7 controls the spin motor 9 to stop the rotation of the substrate W by the spin chuck 2. Thereafter, the processed substrate W is conveyed out from the spin chuck 2 by the conveying robot.

As described above, with the first embodiment, the plurality of droplets of the processing liquid can be sprayed from the spray nozzle 4 by supplying the processing liquid from the processing liquid supply mechanism 11 to the spray nozzle 4 and applying voltage to the piezo element 14 by the voltage applying mechanism 16. The droplets of the processing liquid can thereby be made to collide against the substrate W held by the spin chuck 2 and the foreign substances attached to the substrate W can be removed physically by the kinetic energy of the droplets. Further, by controlling the pressure of the processing liquid supplied to the spray nozzle 4 and the vibration of the piezo element 14, the variation in size and speed of the droplets can be suppressed. Satisfactory cleaning can thus be performed.

Also, with the first embodiment, the processing liquid flow passageway 31 provided in the main body 26 of the spray nozzle 4 includes the plurality of branch flow channels 36. By branching the processing liquid flow passageway 31, the processing liquid flow passageway 31 can be increased in total length. A larger number of discharge ports 33 can thereby be connected individually to the processing liquid flow passageway 31. A larger number of droplets can thereby be sprayed at the same time from the spray nozzle 4. Further, increase in a maximum flow path area can be suppressed or prevented and thus enlargement of the spray nozzle 4 can be suppressed. Yet further, the plurality of discharge ports 33 are aligned along the corresponding branch flow channel 36 and thus increase in the maximum flow path area can be suppressed. Enlargement of the spray nozzle 4 can thereby be suppressed.

Also, with the first embodiment, the main body 26 of the spray nozzle 4 is formed of quartz. Quartz is higher in strength than, for example, a resin. Thus, by forming the main body 26 from quartz, enlargement of the spray nozzle 4 can be suppressed while securing strength of the spray nozzle 4. Further, quartz has resistance against chemicals. Thus, by forming the main body 26 from quartz, corrosion of the spray nozzle 4 can be suppressed or prevented.

Also, with the first embodiment, the wiring 15 for applying voltage to the piezo element 14 is connected to the piezo element 14 inside the cover 27. The piezo element 14 and the wiring 15 are thus protected by the cover 27. Thus, even in a case where the spray nozzle 4 is used in a chemical solution atmosphere, exposure of the piezo element 14 and the wiring 15 to the chemical solution atmosphere can be suppressed or prevented. Corrosion of the piezo element 14 and the wiring 15 due to contact with the chemical solution can thus be suppressed or prevented.

Also, with the first embodiment, the connection channels 32 connecting the branch flow channels 36 and the discharge ports 33 are disposed in the main body 26 of the spray nozzle 4. The processing liquid that flows through the branch flow channels 36 is discharged from the discharge ports 33 via the connection channels 32. Each of the connection channel 32 includes the reduced portion 40 that reduces in flow path area as the discharge port 33 is approached. The flow path area of the reduced portion 40 reduces in a continuous manner as the discharge port 33 is approached. Lowering in pressure of the processing liquid in the connection channel 32 can thereby be reduced. That is, pressure loss in the connection channel 32 can be reduced. Also, concentration of stress in the connection channel 32 can be suppressed or prevented because the flow path area of the reduced portion 40 reduces in a continuous manner.

Also, with the first embodiment, the main body 26 is formed by joining together the upper divided body 41 and the lower divided body 42. The upper divided body 41 and the lower divided body 42 are formed individually before being joined to each other. That is, the upper recess portion 44 and the lower recess portion 43 that form the processing liquid flow passageway 31 and the connection channels 32 are formed in the upper divided body 41 and the lower divided body 42, respectively, before the upper divided body 41 and the lower divided body 42 are joined to each other. The reduced portions 40, which are provided in the connection channels 32, are difficult to form from the discharge port 33 side because each reduced portion 40 reduces in flow path area as the discharge port 33 is approached. On the other hand, before the joining of the upper divided body 41 and the lower divided body 42, the reduced portions 40 can be formed from the branch flow channel 36 side. The reduced portions 40 can thus be formed readily.

Also, with the first embodiment, the processing liquid drain pipe 13 is connected to the drain port 30 of the spray nozzle 4 and the drain valve 12 is interposed in the processing liquid drain pipe 13. In the state where the drain valve 12 is closed, the processing liquid supplied to the supply port 29 of the spray nozzle 4 passes through the processing liquid flow passageway 31 and is discharged from the plurality of discharge ports 33. Also, in the state where the drain valve 12 is open, the processing liquid supplied to the supply port 29 of the spray nozzle 4 passes through the processing liquid flow passageway 31 and is drained from the drain port 30. Thus, in both the state where the drain valve 12 is closed and the state where the drain valve 12 is open, retention of the processing liquid in the processing liquid flow passageway 31 is prevented. Occurrence of bacteria inside the spray nozzle 4 due to retention of the processing liquid can thereby be suppressed or prevented. Contamination of the substrate W due to supplying of droplets of a processing liquid that contains bacteria to the substrate W can thus be suppressed or prevented.

Also, with the first embodiment, in the two columns L1 corresponding to the same branch flow channel 36, the plurality of discharge ports 33 making up one column L1 and the plurality of discharge ports 33 making up the other column L1 are disposed in an alternating manner when viewed from the horizontal direction orthogonal to the two columns L1. That is, with the two different columns L1, the one column L1 includes the discharge ports 33 that are disposed so as not to overlap with the discharge ports 33 making up the other column L1 when viewed from any direction orthogonal to the two columns L1. Thus, when the spray nozzle 4 is moved while the plurality of droplets of the processing liquid are supplied from the spray nozzle 4 to the upper surface of the substrate W, the range in which the droplets of the processing liquid collide with the upper surface of the substrate W spreads and the droplets of the processing liquid are supplied uniformly to the upper surface of the substrate W. The time required for cleaning the substrate W can thus be reduced and uniformity of cleaning can be improved.

A second embodiment of the present invention shall now be described. A principal point of difference of the second embodiment is the relative position of the spray nozzle 4 with respect to the locus X1. That is, whereas in the first embodiment, only a portion of the columns L1 intersects the locus X1, in the second embodiment, all the columns L1 intersect the locus X1. With FIG. 11 to FIG. 13 referred to below, component portions equivalent to portions indicated in FIG. 1 to FIG. 10 described above are provided with the same reference symbols as in FIG. 1, etc., and description thereof shall be omitted.

Figure 11:
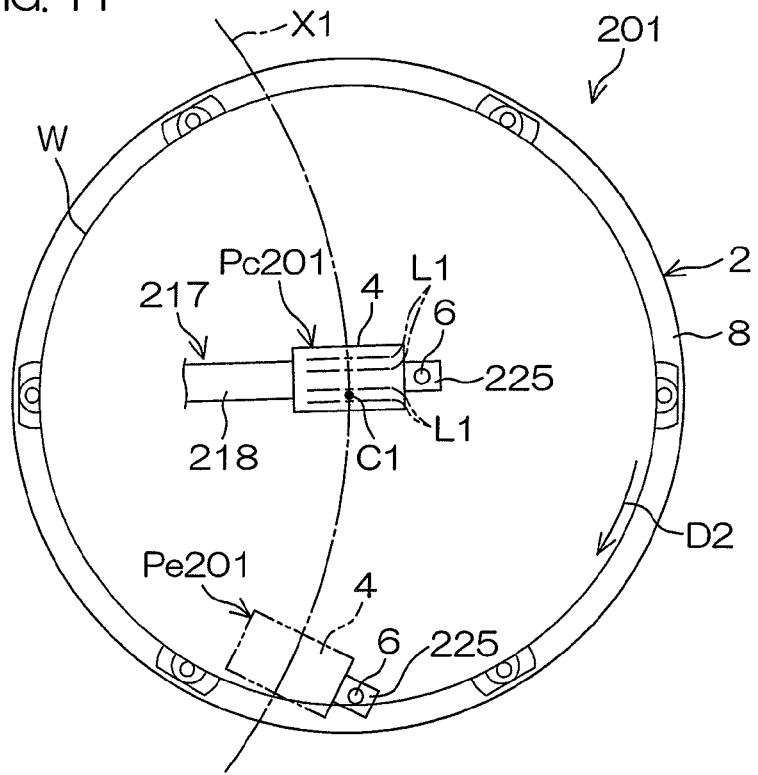
FIG. 11 is a plan view of a spray nozzle and an arrangement related thereto according to a second embodiment of the present invention.
Figure 12:
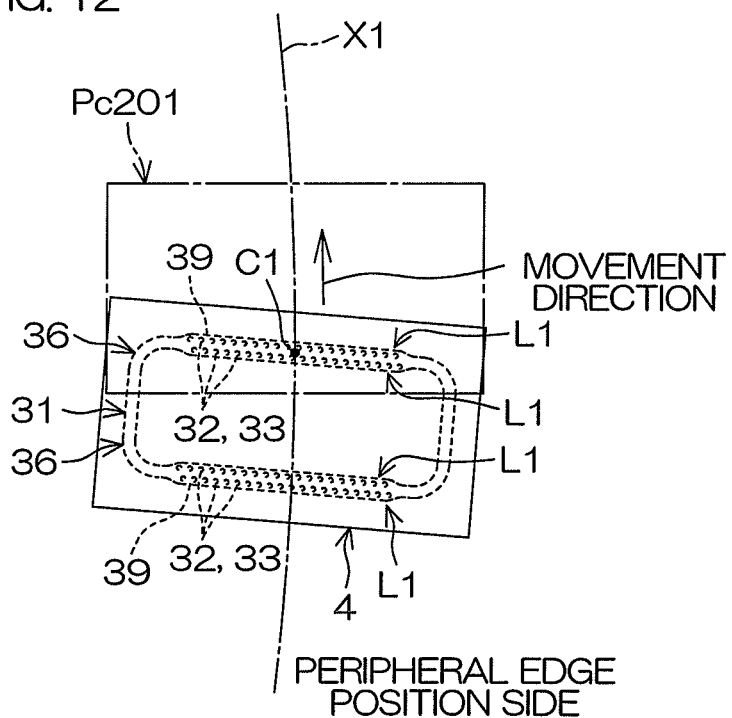
FIG. 12 is a plan view of a state immediately before the spray nozzle reaches a central position.
Figure 13:
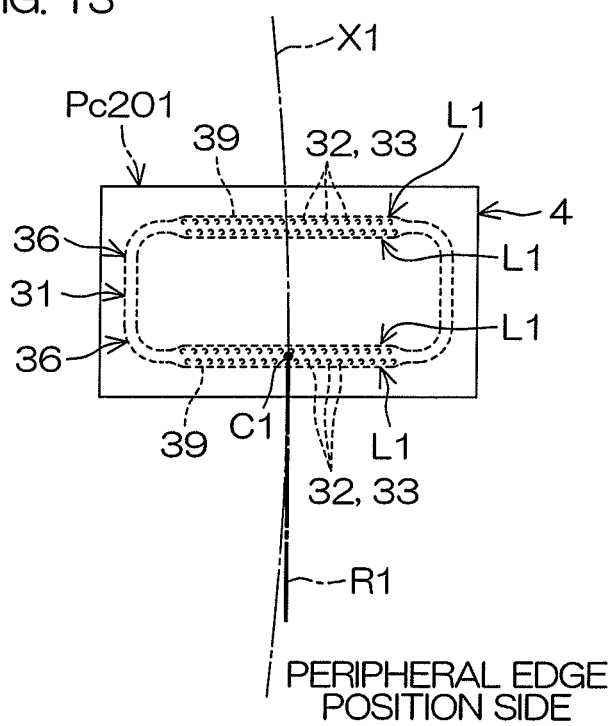
FIG. 13 is a plan view of a state in which the spray nozzle is positioned at the central position.

FIG. 11 is a plan view of the spray nozzle 4 and an arrangement related thereto according to the second embodiment of the present invention. FIG. 12 is a plan view of a state immediately before the spray nozzle 4 reaches a central position Pc201. FIG. 13 is a plan view of a state in which the spray nozzle 4 is positioned at the central position Pc201.

With the exception of the nozzle arm and the stay, a substrate processing apparatus 201 according to the second embodiment has the same arrangement as the substrate processing apparatus 1 according to the first embodiment. That is, as shown in FIG. 11, a nozzle moving mechanism 217 (nozzle moving unit) included in the substrate processing apparatus 201 includes the nozzle arm 218. The nozzle arm 218 holds the spray nozzle 4 so that, when viewed from a perpendicular direction perpendicular to the upper surface of the substrate W held by the spin chuck 2 (the vertical direction D1 in the second embodiment), the four columns L1 intersect the locus X1. The second rinsing liquid nozzle 6 is fixed to the spray nozzle 4 by a stay 225. The spray nozzle 4 and the second rinsing liquid nozzle 6 are aligned in the rotation direction D2 of the substrate W by the spin chuck 2.

In cleaning the substrate W by discharging the droplets of the processing liquid from the spray nozzle 4, the control device 7 makes the spray nozzle 4 reciprocate a plurality of times between the central position Pc201 at which the spray nozzle 4 overlaps with the center C1 of the upper surface of the substrate W when viewed from the vertical direction D1 and a peripheral edge position Pe201 at which the spray nozzle 4 and the peripheral edge of the substrate W overlap when viewed from the vertical direction D1 while rotating the substrate W by means of the spin chuck 2. As shown in FIG. 13, the central position Pc201 is a position at which the middle portion 39 positioned at the peripheral edge position Pe201 side overlaps with the center C1 of the upper surface of the substrate W when viewed from the vertical direction D1. In the state where the spray nozzle 4 is positioned at the central position Pc201, the two columns L1 corresponding to the middle portion 39 positioned at the peripheral edge position Pe201 side are orthogonal to the tangential line of the locus X1 at the center C1. As shown in FIG. 11, in a state where the spray nozzle 4 is positioned between the central position Pc201 and the peripheral edge position Pe201, the second rinsing liquid nozzle 6 is positioned at the upstream side of the spray nozzle 4 in regard to the rotation direction D2 of the substrate W. The control device 7 thus moves the spray nozzle 4 in a range in which the second rinsing liquid nozzle 6 is positioned at the upstream side of the spray nozzle 4 in regard to the rotation direction D2 of the substrate W.

Also, as shown in FIG. 12, immediately before the spray nozzle 4 reaches the central position Pc201, the middle portion 39 that is positioned at the opposite side with respect to the peripheral edge position Pe201 overlaps with the center C1 of the upper surface of the substrate W when viewed from the vertical direction D1. Also, as shown in FIG. 13, in the state where the ejection nozzle 4 is positioned at the central position Pc201, the middle portion 39 positioned at the peripheral edge position Pe201 side overlaps with the center C1 of the upper surface of the substrate W when viewed from the vertical direction D1. The control device 7 thus moves the ejection nozzle 4 along the locus X1 so that, between the central position Pc201 and the peripheral edge position Pe201, all of the columns L1 overlap successively with the center C1 of the upper surface of the substrate W when viewed from the vertical direction D1.

As described above, with the second embodiment, the nozzle moving mechanism 217 holds the spray nozzle 4 so that when viewed from the vertical direction D1, the plurality of columns L1 formed by the plurality of discharge ports 33 intersect the locus X1. That is, when viewed from the vertical direction D1, all of the columns L1 intersect the locus X1. The droplets of the processing liquid sprayed from all of the columns L1 can thus be made to collide successively against the upper surface central portion of the substrate W by moving the spray nozzle 4 along the locus X1 while making the droplets of the processing liquid be sprayed from the spray nozzle 4. On the other hand, in the case where all of the columns L1 do not intersect the locus X1 as in the first embodiment, only the droplets of the processing liquid sprayed from a portion of the columns L1 (in the first embodiment, the two columns L1 corresponding to the one middle portion 39) are supplied to the upper surface central portion of the substrate W. Thus, by making all of the columns L1 intersect the locus X1, a number of times of collision of the droplets against the upper surface central portion of the substrate W can be increased. The upper surface central portion of the substrate W can thereby be cleaned satisfactorily.

Also, with the second embodiment, the control device 7 moves the spray nozzle 4 between the central position Pc201 and the peripheral edge position Pe201. A movement range of the spray nozzle 4 is thus narrow in comparison to a case of moving the spray nozzle 4 between two positions (a first peripheral edge position and a second peripheral edge position) at which the spray nozzle 4 overlaps with the upper surface peripheral edge of the substrate W when viewed from the vertical direction D1. Further, the second rinsing liquid nozzle 6 can be constantly positioned at the upstream side of the spray nozzle 4 in regard to the rotation direction D2 of the substrate W because the control device 7 moves the spray nozzle 4 between the central position Pc201 and the peripheral edge position Pe201. The rinsing liquid discharged from the second rinsing liquid nozzle 6 can thus be supplied in advance to the portion of the upper surface of the substrate W onto which the droplets of the processing liquid are sprayed. The portion of the upper surface of the substrate W onto which the droplets of the processing liquid are sprayed can thereby be protected reliably by the rinsing liquid.

Although the embodiments of the present invention have been described above, the present invention is not limited to the contents of the above-described first and second embodiments and can be variously modified within the scope of the appended claims.

For example, although with each of the first and second embodiments, a case where the processing liquid flow passageway 31 includes two branch flow channels 36 has been described, the processing liquid flow passageway 31 may include three or more branch flow channels 36 instead.

Also, although with each of the first and second embodiments, a case where two columns L1 are provided in a single branch flow channel 36 has been described, the number of columns L1 provided in a single branch flow channel 36 may be one or may be no less than three.

Also, although with each of the first and second embodiments, a case where two columns L1 are provided in each of the two branch flow channels 36 has been described, the numbers of columns L1 provided in the respective branch flow channels 36 may differ.

Also, although with each of the first and second embodiments, a case where the plurality of branch flow channels 36 branch at the lower end of the upstream side collecting flow channel 34 that is the branching position and collect together at the lower end of the downstream side collecting flow channel 35 that is the collecting position has been described, a branching/collecting position may also be provided between the branching position and the collecting position. That is, the plurality of branch flow channels 36 that branch at the branch position may collect together and re-branch at the branching/collecting position and then collect together again at the collecting position.

Also, although with each of the first and second embodiments, a case where the interval between two adjacent discharge ports in the same column L1 is fixed in all the columns L1 has been described, a column L1 may be provided that includes two discharge ports 33 that are aligned at an interval that differs from that of the other columns L1.

Also, although with each of the first and second embodiments, a case where the plurality of discharge ports 33 making up the same column L1 are aligned at equal intervals has been described, the plurality of discharge ports 33 making up the same column L1 do not have to be aligned at equal intervals.

Also, although with each of the first and second embodiments, a case where a single piezo element 14 is mounted to the upper surface of the main body 26 has been described, a plurality of piezo elements 14 may be mounted to the main body 26 instead. Preferably in this case, the AC voltage is applied to the plurality of piezo elements 14 in a manner such that the vibrations of the piezo elements 14 are matched in phase. Also, the mounting positions of the piezo elements 14 with respect to the main body 26 are not restricted to the upper surface of the main body 26 and may be at a side surface or other position of the main body 26 besides the upper surface. Specifically, all of the piezo elements 14 may be mounted to a side surface of the main body 26. Also, in a case where a plurality of piezo elements 14 are mounted to the main body 26, the piezo elements 14 may be mounted to the upper surface and a side surface of the main body 26.

Also, although with each of the first and second embodiments, a case where the locus X1 is a curve has been described, the locus X1 may be a straight line instead. That is, the locus X1 may be a straight line that extends along the upper surface of the substrate W held by the spin chuck 2 and passes through the center C1 of the upper surface of the substrate W when viewed from the perpendicular direction perpendicular to the upper surface of the substrate W.

Also, although with the first or second embodiment, a case where the substrate processing apparatus 1 or 201 is an apparatus that processes a circular substrate, such as a semiconductor wafer, etc., has been described, the substrate processing apparatus 1 or 201 may be an apparatus that processes a polygonal substrate, such as a glass substrate for liquid crystal display device.

Further, with the second embodiment, in the state where the spray nozzle 4 is positioned at the central position Pc201, the spray nozzle 4 is held by the nozzle arm 18 in a manner such that the two columns L1 corresponding to the middle portion 39 positioned at the peripheral edge position Pe201 side are orthogonal to the tangential line of the locus X1 at the center C1. However, it suffices that the spray nozzle 4 be held in a manner such that the four columns L1 intersect the locus X1, and, for example, the spray nozzle 4 may be held by the nozzle arm 18 in a manner such that two columns L1 are oblique with respect to the radius R1 of the substrate W.

Although the embodiments of the present invention have been described in detail, these embodiments are merely specific examples used to clarify the technical contents of the present invention, and the present invention should not be understood as being limited to these specific examples, and the scope of the present invention are limited solely by the appended claims.

The present application corresponds to Japanese Patent Application No. 2011-044375 filed in the Japan Patent Office on Mar. 1, 2011 and Japanese Patent Application No. 2011-075660 filed in the Japan Patent Office on Mar. 30, 2011, and the entire disclosures of these applications are incorporated herein by reference.

What is claimed is:

1. A substrate processing method comprising:
   a step of supplying a processing liquid to a supply port of a nozzle, having a main body in which the supply port is formed and a piezo element, in a state where the nozzle faces a major surface of a substrate; and
   a step of applying voltage to the piezo element of the nozzle in parallel to the step of supplying the processing liquid;
   wherein the nozzle is arranged to discharge droplets of the processing liquid toward the substrate,
   the main body includes:
   the supply port supplied with the processing liquid;
   a drain port from which the processing liquid supplied to the supply port is drained;
   a processing liquid flow passageway connecting the supply port and the drain port, the processing liquid flow passageway including a plurality of branch flow channels branching out between the supply port and the drain port and collecting together between the supply port and the drain port; and
   a plurality of discharge ports forming a plurality of columns respectively corresponding to the plurality of branch flow channels, being aligned along the corresponding branch flow channels, and being connected to the corresponding branch flow channels; and
   the piezo element is arranged to apply vibration to the processing liquid flowing through the plurality of branch flow channels.

2. A substrate processing method comprising:
   a substrate holding and rotating step of holding and rotating a substrate; and
   a nozzle moving step of moving a nozzle, having disposed therein a plurality of columns, in each of which a plurality of discharge ports arranged to discharge droplets of a processing liquid are aligned in a single column, and discharging the droplets of the processing liquid toward the substrate, along a locus passing through a rotation center of a major surface of the substrate when viewed from a perpendicular direction perpendicular to the major surface;
   wherein in the nozzle moving step, the nozzle is held so that, when viewed from the perpendicular direction, the plurality of columns intersect the locus.

3. The substrate processing method according to claim 2, wherein the nozzle moving step includes a step of moving the nozzle along the locus so that, between a central position at which the nozzle overlaps with the rotation center of the major surface when viewed from the perpendicular direction and a peripheral edge position at which the nozzle overlaps with a peripheral edge of the major surface when viewed from the perpendicular direction, the plurality of columns overlap successively with the rotation center of the major surface when viewed from the perpendicular direction.

* * * * *